(12) United States Patent
Peng et al.

(10) Patent No.: US 7,106,304 B2
(45) Date of Patent: Sep. 12, 2006

(54) KEYPAD DEVICE AND OPERATION METHOD THEREOF

(75) Inventors: Yu-Chun Peng, Tainan (TW);
Shao-Chun Ho, Hsinchu (TW);
Hsi-Cheng Yeh, Tauyuan (TW);
Chih-Ming Hsu, Keelung (TW)

(73) Assignee: High Tech Computer Corp., Taoyuan (TW)

( * ) Notice: Subject to any disclaimer, the term of this patent is extended or adjusted under 35 U.S.C. 154(b) by 442 days.

(21) Appl. No.: 10/618,875

(22) Filed: Jul. 14, 2003

(65) Prior Publication Data
US 2004/0075649 A1    Apr. 22, 2004

(30) Foreign Application Priority Data
Oct. 16, 2002    (TW) .............................. 91123856 A

(51) Int. Cl.
*G09G 5/00* (2006.01)
(52) U.S. Cl. ........................................ 345/168; 341/22
(58) Field of Classification Search ........ 345/168–169; 341/101, 22
See application file for complete search history.

(56) References Cited
U.S. PATENT DOCUMENTS

| | | | |
|---|---|---|---|
| 3,909,818 A * | 9/1975 | Dalke et al. ................ 345/467 |
| 5,220,601 A | 6/1993 | Gulick et al. ................ 379/368 |
| 5,585,792 A | 12/1996 | Liu et al. ........................ 341/22 |
| 5,760,714 A * | 6/1998 | Zimmerman ................. 341/26 |
| 5,925,110 A * | 7/1999 | Klein ........................... 710/15 |
| 5,958,023 A | 9/1999 | Klein ........................... 710/18 |
| 6,072,472 A | 6/2000 | Shiga ........................ 345/168 |
| 6,489,950 B1 * | 12/2002 | Griffin et al. ................ 345/168 |

\* cited by examiner

*Primary Examiner*—Kent Chang
(74) *Attorney, Agent, or Firm*—Thomas, Kayden, Horstemeyer & Risley

(57) ABSTRACT

A keypad device including a parallel/serial conversion device, a keypad module, and a controller coupled to the parallel/serial conversion device and the keypad module. The keys in the keypad module are arranged in parallel. After the key is triggered, an interrupt signal will be fed to the controller. On receiving the interrupt signal, the controller will feed a drive voltage to the keypad module generating a parallel signal therein. After causing the parallel/serial conversion device to read and store the parallel signal, the controller will be able to read the parallel signal serially by using the clock signals. The status of the keypad module can thereby be obtained.

5 Claims, 2 Drawing Sheets

KEYPAD DEVICE AND OPERATION METHOD THEREOF

This application claims the benefit of Taiwan application Serial No. 91123856, filed Oct. 16, 2002.

BACKGROUND OF THE INVENTION

1. Field of the Invention

The invention relates to a keypad device and an operation method thereof, and more particularly to a keypad device and a method for reading keypad signals of the keypad device.

2. Description of the Related Art

Of the circuit designs of keypad devices, the direct type and the matrix type are two most common ones. According to the direct type keypad device, keys are directly connected to the GPIO (General Purpose Input Output) pins of a controller wherein the controller determine the statuses of the keys directly. Such a structure is indeed simple and direct. Since each key requires a particular GPIO pin, a large number of GPIO pins will be occupied if a large number of keys are required. As a controller has only a limited number of GPIO pins, it would be unwise to use up all the GPIO pins on keypad circuits. This is the limitation imposed upon the design of the direct type keypad device. It is noteworthy that the direct type keypad device cannot be applied in the circuit design with a great number of keys. Besides, whether or not the input pins of the controller have the interrupt function also needs to be considered. If the pins in service do not have the interrupt function, the controller has to monitor the status of every pin via ceaseless queries in order to determine if a key has been triggered or not. Therefore, the keypad device will occupy a large part of bandwidth and resource of the controller.

In order to reduce the number of GPIO pins needed, the matrix-type keypad device is thus developed. In the design of The matrix-type keypad circuit, crisscross lines are arrangedina matrix, and every key is arranged at a node of an intersection point between a row line and a column line. The status of the key is scanned and then reported to the controller. Since the controller has to continuously scan the status of the matrix composed of the keypad device, The controller needs a specific algorithm to incorporate with the operation of the keypad matrix, consuming additional power and resources of the controller. On the other hand, the column signals and row signals of the matrix circuit are coupled to a number of GPIO pins of the controller. With the number of keys being set at a predetermined number, There is no significant decrease in the number of controller pins required. Thus, the matrix-type keypad device is usually applied in The occasions when the number of keys required is large. For instance, The matrix-type keypad device can be applied in a computer keyboard.

In the application of the PDA (Personal Digital Assistant), the design of the number of keys has to take into account the functional appeals and size of a product. If the matrix-type circuit design is adopted, the required number of GPIO pins of a controller can only be slightly reduced. In addition, the controller will consume more power and system resources to scan the keypad matrix sequentially, which is difficult to be accepted in the application of PDA when battery durability is highly emphasized. On the other hand, if the direct-type circuit design is adopted, as the keys required a large amount of GPIO pins of the controller, the number of pins available for other circuits becomes smaller. This will cause more difficulties in the design of circuits.

SUMMARY OF THE INVENTION

It is therefore an object of the invention to provide a keypad device and an operation method thereof capable of reducing the required number of GPIO pins of the controller and reducing power and resource consumption of the controller.

The invention achieves the above-mentioned object by providing a keypad device including a parallel/serial conversion device, a keypad module, and a controller coupled to the parallel/serial conversion device and the keypad module. The keys in the keypad module are arranged in parallel. After the key is triggered, an interrupt signal will be fed to the controller. On receiving the interrupt signal, the controller will feed a drive voltage to the keypad module generating a parallel signal therein. After causing the parallel/serial conversion device to read and temporarily store the parallel signal, the controller will be able to read the parallel signal serially using the clock signals. The status of the keypad module can thereby be obtained.

Other objects, features, and advantages of the invention will become apparent from the following detailed description of the preferred but non-limiting embodiments. The following description is made with reference to the accompanying drawings.

DETAILED DESCRIPTION OF THE INVENTION

Embodiment One

Figure 1:
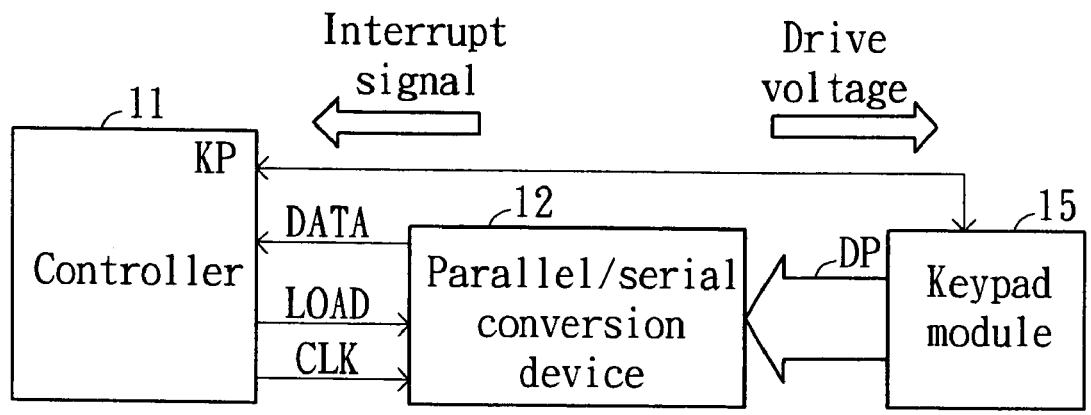
FIG. 1 is a block diagram showing a keypad device according to a first embodiment of the invention.

Refer to FIG. 1, a block diagram showing a keypad device according to a first embodiment of the invention. The keypad device includes a parallel/serial conversion device 12, a keypad module 15, and a controller 11 which is used to be coupled to an electrical device, say, a PDA for instance. The keypad module 15 includes a number of keys with all of them being arranged in parallel possessing the features of expandability and simplicity. Before the keypad module 15 is triggered, the input/output pin KP of the controller 11 functions as an input pin; after the keypad module 15 is triggered, an interrupt signal will be fed to the input/output pin KP.

Figure 2:
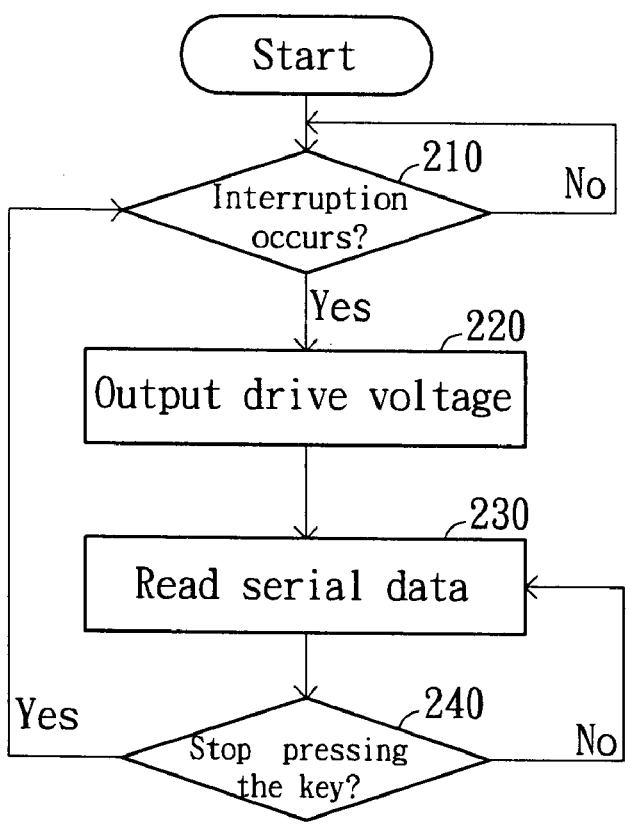
FIG. 2 is a flow chart showing a method for reading keying signals in the keypad device of FIG. 1.

After having received the interrupt signal, the controller 11 will convert the function of the input/output pin KP into an output pin and feed a drive voltage to the keypad module 15 via the input/output pin KP causing the keypad module 15 to output a parallel signal DP. Next, the controller 11 will feed a load signal LOAD to the parallel/serial conversion device 12 whereby the parallel signal DP is read and temporarily stored. Finally, by using a clock signal CLK, the controller 11 will convert the parallel signal DP of the parallel/serial conversion device 12 into a serial signal DATA. Thus, the status of the keypad module 15 will be obtained according to the serial signal DATA. The method for reading the keying signals will be described with reference to FIG. 2.

After the keypad module 15 having been triggered, the controller 11 will immediately determine the interrupt signal (step 210), and feed the drive voltage to the keypad module 15 causing the keypad module 15 to generate the parallel signal DP (step 220). Next, after the parallel signal DP having been converted into a serial signal DATA, the controller 11 will determine the status of the keypad module 15 according to the serial signal DATA (step 230). If the user keeps pressing the key, the controller 11 will read the serial signal DATA continuously. Otherwise, the input/output pin KP will be restored to been input pin with the interrupt function being resumed. Return to step 210 (step 240).

Figure 3:
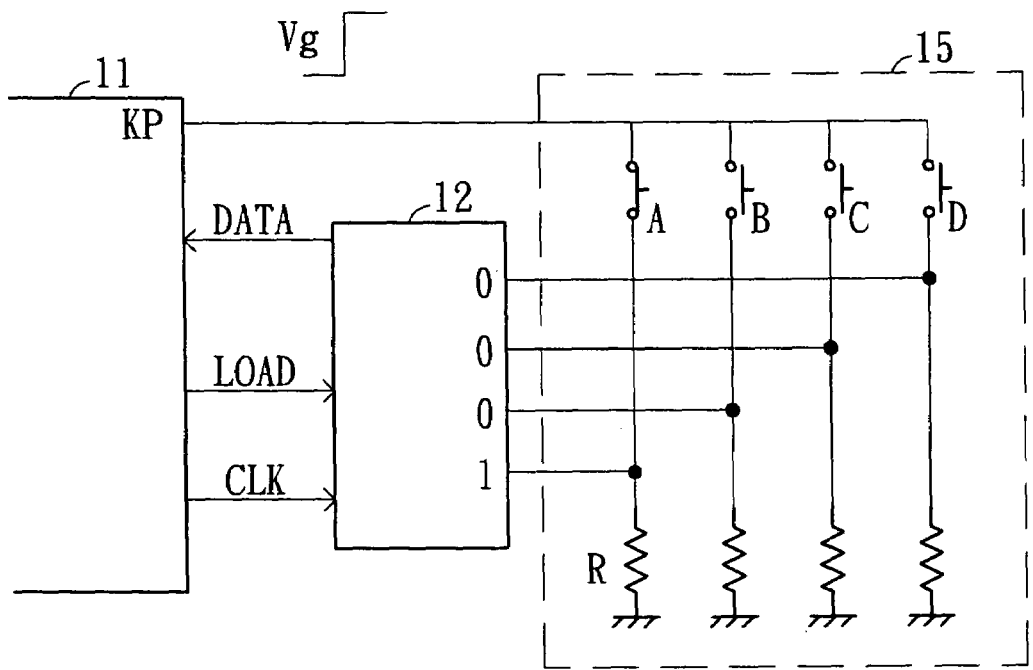
FIG. 3 is a schematic illustration showing the detailed structure of the keypad device of FIG. 1.

Next, refer to FIG. 3, a schematic illustration showing the detailed structure of the keypad device. The keypad module 15 can include four parallelly connected keys A, B, C, and D. Before the keys are triggered or pressed, the input/output pin KP of the controller 11 remains a high-level voltage while the input/output pin KP functions as an input pin. After the key A having been triggered, the high-level voltage of the input/output pin KP is changed to a low-level voltage and an interrupt signal is generated. After the controller 11 having received the interrupt signal from the input/output pin KP, the input/output pin KP will be converted into an output pin, and the drive voltage Vg will be fed to the keypad module 15 via the input/output pin KP.

Of The four keys only key A is pressed, so only the key A connected to the resistor R and the input/output pin KP is in a close state, while The keys B, C, and D connected to the other three resistors, and the input/output pin KP are in an open state. Therefore, the resistor R connected to key A is driven by the drive voltage Vg and Thus provides a high voltage, while the other three resistors provide a low voltage causing the keypad module 15 to generate a "0001" parallel signal corresponding to the parallel signal DP of FIG. 1. Obviously, if both key A and key C are pressed, the keypad module 15 will generate a "0101" parallel signal. If all the keys are pressed, the keypad module 15 will generate an "1111" parallel signal. Therefore, the value of the parallel signal can indicate the status of the keypad module 15.

After the parallel signal having been generated, the controller 11 will feed the load signal LOAD to the parallel/serial conversion device 12 causing the parallel/serial conversion device 12 to read the parallel signals in parallel and have them stored. Next, the controller 11 simply needs to feed the clock signal CLK to the parallel/serial conversion device 12 in order that the parallel signal can be output in sequence aecordingly to generate the serial signal DATA. It is noteworthy that the keypad module 15 according to the invention parallelly feeds the parallel signals DP to the parallel/serial conversion device 12 at the same time, and the parallel/serial conversion device 12 converts the parallel signals DP into serial signals DATA which is output sequentially. If the user presses several keys at a time, the status of the key can still be correctly detennined.

As for the aspect of reducing the system resource usage, the method for generating the interrupt signal adopted in the invention has great advantages. This is because the controller does not need to respond to the keypad module before at least one of the keys is pressed. Only after the key has been pressed, an interrupt signal will be generated to inform the controller of the need to process ensuing jobs such as data input and recognition. That is, the controller does not need to process the output signal from the keypad module before an interrupt signal is received. Thus, there is no need to continuously scan and query the stats of the keyboard device, thus the requirement of sy stem resources will be greatly reduced.

Embodiment Two

Figure 4:
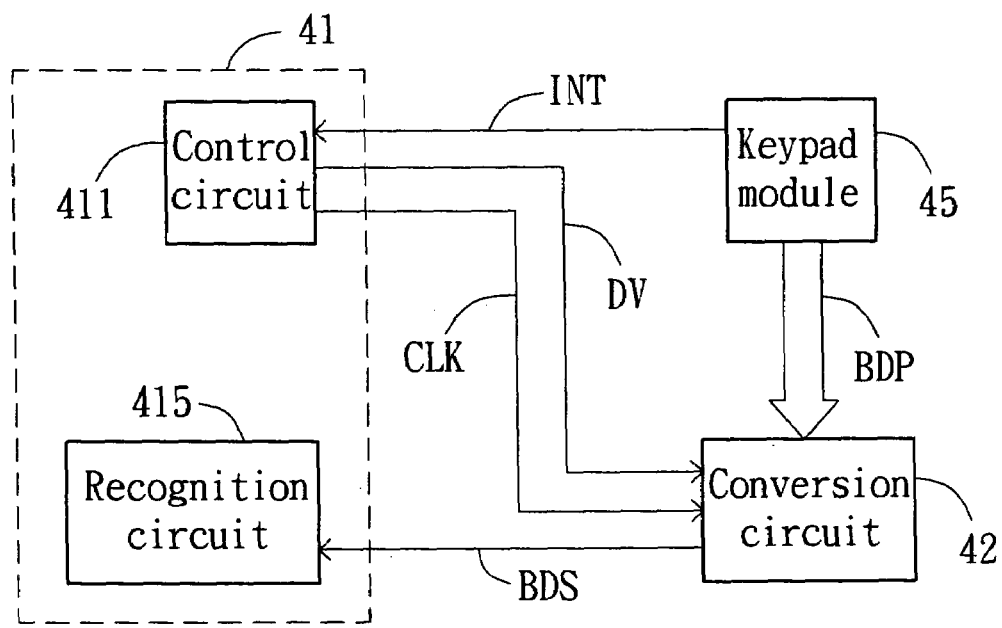
FIG. 4 is a block diagram showing a keypad device according to a second embodiment of the invention.

Refer to FIG. 4, a block diagram showing a keypad device according to a second embodiment of the invention. The keypad device includes a keypad module 45, a conversion circuit 42, a control circuit 411 and a recognition circuit 415, wherein the control circuit 411 and the recognition circuit 415 can be installed in a micro-controller 41. When the keys in the keypad module 45 are pressed, the keypad module 45 will output an interrupt signal INT of low-level voltage to the control circuit 411. After having received the interrupt signal INT, the control circuit 411 will feed a drive voltage DV of high-level voltage to the conversion circuit 42 causing the conversion circuit 42 to receive a module status data BDP parallelly generated from the keypad module 45. The module status data BDP, which can contain data of several bits, 8 bits for example, corresponds to the status of the keys in keypad module 45. After the conversion circuit 42 having received the module status data BDP, the control circuit 411 will feed the clock signal CLK to the conversion circuit 42 causing the conversion circuit 42 to serially output every key status data of the module status data BDP according to the timing of the clock signal CLK. The key status data serially output from the conversion circuit 42 can be marked as key status data BDS. After the recognition circuit 415 receives the key status data BDS, the pressed key(s) can thus be recognized according to the value of the key status data BDS.

The keypad device and operation method of the invention have the following advantages:

1. Saving the required number of GPIO pins;
2. Saving system resources for the status of the key can be obtained sparing the use of scan and query; and
3. Being applicable to the occasion when a number of keys are pressed at the same time.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A keypad device to be applied in an electrical device, wherein the keypad device comprises:
    a keypad module including a plurality of keys and respective output pins of the keys, the keypad module being used for outputting an interrupt signal when at least one of the keys is pressed, and for outputting a parallel signal corresponding to the keys through the output pins when the keypad module receives a drive signal;
    a parallel/serial conversion device coupled to the output pins of the keypad module for receiving the parallel signal and outputting a serial signal according to the parallel signal; and
    a controller, coupled to the keypad module and the parallel/serial conversion device respectively, wherein the controller includes an input/output pin, coupled to the keypad module, for receiving the interrupt signal and outputting the drive voltage in response to the interrupt signal, and the controller receives the serial signal and determines the status of the keypad module according to the serial signal received;
    wherein the controller, in response to the interrupt signal, sets the input/output pin as an output pin to output the drive voltage to the keypad module to enable the keypad module to output the parallel signal.

2. The keypad device according to claim 1, wherein when the controller determines that no key of the keypad module is being pressed according to the serial signal received, the controller sets the input/output pin which is coupled to the keypad module as an input pin.

3. The keypad device according to claim 1, wherein the electrical device is a PDA (Personal Digital Assistant).

4. The keypad device according to claim 1, wherein the keypad module further includes a first pin coupled to the input/output pin of the controller, and when at least one of the keys is pressed, the keypad module outputs the interrupt signal to the controller through the first pin.

5. The keypad device according to claim 4, wherein the controller sets the input/output pin as an input pin so that the controller receives the interrupt signal from the keypad module when at least one of the keys is pressed.

\* \* \* \* \*